(12) United States Patent
Fang et al.

(10) Patent No.: US 8,339,143 B2
(45) Date of Patent: Dec. 25, 2012

(54) LENS CONNECTOR-TESTING DEVICE

(75) Inventors: Hung-yuan Fang, Tu Cheng (TW);
Feng-chi Lee, Tu Cheng (TW);
Kuo-chuan Chiu, Tu Cheng (TW)

(73) Assignee: Cheng UEI Precision Industry Co., Ltd., Tu Cheng, Taipei (TW)

( * ) Notice: Subject to any disclaimer, the term of this patent is extended or adjusted under 35 U.S.C. 154(b) by 351 days.

(21) Appl. No.: 12/848,847

(22) Filed: Aug. 2, 2010

(65) Prior Publication Data
US 2012/0025843 A1 Feb. 2, 2012

(51) Int. Cl.
*G01R 31/04* (2006.01)
*H01R 3/00* (2006.01)

(52) U.S. Cl. .......................................... 324/538; 439/162

(58) Field of Classification Search .................... 324/538
See application file for complete search history.

(56) References Cited

U.S. PATENT DOCUMENTS

| | | | |
|---|---|---|---|
| 3,267,634 A * | 8/1966 | Omori ............................... | 53/433 |
| 7,301,636 B2 * | 11/2007 | Jung et al. ...................... | 356/402 |
| 7,717,756 B1 * | 5/2010 | Yin et al. ........................ | 439/700 |
| 8,011,557 B1 * | 9/2011 | Zhang et al. ................... | 228/4.5 |

* cited by examiner

*Primary Examiner* — Jeff Natalini
(74) *Attorney, Agent, or Firm* — Cheng-Ju Chiang

(57) ABSTRACT

Provided is a lens connector-testing device including a base, a circuit tester, a probe, and a positioning unit. The positioning unit includes a positioning housing, a lift block, an insulating plate, a press spring, a latch member and a supporting seat. The positioning housing has a lift-guiding groove. The insulating plate is fixedly connected to an upper end of the lift block. A lower end of the lift block is slidably received in the lift-guiding groove. A holding space is defined between the insulating plate and the positioning housing. The supporting seat is disposed on the positioning housing and has at least one electrical contact. The latch member has a fixing section, a hooking section, and a pressing section. The lift block has a projecting portion matched with the hooking section of the latch member. The press spring is located between the pressing section and the positioning housing.

10 Claims, 5 Drawing Sheets

LENS CONNECTOR-TESTING DEVICE

BACKGROUND OF THE INVENTION

1. Field of the Invention

The present invention relates to a testing device, and more particularly to a lens connector-testing device.

2. Description of the Prior Art

With the development of technology, packing of electrical components has become small-scaled, lightweight and high density, thus the electrical products are being developed toward light, thin, short and small direction. At present, not only digital cameras and video cameras but also more and more portable electrical products such as mobile phone, PDA (Personal Digital Assistant), MP3 and so on have the photographing or recording function.

Generally, the portable electrical product having the photographing or recording function employs a lens module to electrically connect a camera lens and an inner circuit board. Wherein the lens module includes a lens connector and a lens. When installing the lens module in the electrical product, the lens connector is welded onto the inner circuit board of the electrical product, and then it is needed to test the conductive state between the lens connector and the lens. If the test result is non-conductive state of the lens connector and the lens, the lens module will be not able to normally work. So the whole lens module will be destroyed and removed, and will be replaced as a new module. Whereas maybe only one part of the lens connector is damaged, replacing and abandoning the whole lens module can result in increasing the costs of manufacture and repair, wasting time and reducing the manufacture efficiency. Therefore, in order to ensure that the lens module can normally work, it is needed to test the conductivity of the lens connector and the lens before the lens connector is welded onto the inner circuit board.

Prior lens connector-testing device mainly adopts a vertical inserting structure, which not including a lens connector-fixing structure, and a testing probe is fixedly mounted on a base. But this prior lens connector-testing device cannot ensure the testing probe to exactly contact with the contact of the lens connector thereby resulting in a heavy operation and a low testing efficiency. Furthermore, when the probe is inserted into the lens connector, the probe is easily deformed or even destroyed under the pressure function of the lens connector, so that affecting the testing circuit connection between the probe and the contact of the lens connector and directly affecting the testing accuracy. Moreover, because the testing probe is fixedly mounted on the base, the testing probe cannot match with other contacts of lens connector having different layouts. Thus the prior lens connector-testing device can test only single type of lens connector.

BRIEF SUMMARY OF THE INVENTION

An object of the present invention is to provide a lens connector-testing device having advantages of easily operated, efficiently testing, achieving a high testing accuracy, and capable of testing various lens connectors.

To achieve the above object, in accordance with the present invention, a lens connector-testing device is provided, comprising a base, a circuit tester mounted on the base, a probe connected to the circuit tester by wires, and a positioning unit. The positioning unit comprises a positioning housing, a lift block, an insulating plate, a press spring, a latch member and a supporting seat. The positioning housing has a lift-guiding groove formed on a sidewall thereof. One end of the insulating plate is fixedly connected to an upper end of the lift block. A lower end of the lift block is slidably received in the lift-guiding groove. A holding space is defined between the other end of the insulating plate and the positioning housing. The supporting seat is disposed on the positioning housing located in the holding space and has at least one electrical contact electrically connected to the circuit tester and electrically connected with a lens connector. The latch member has a fixing section pivotally jointed to the positioning housing, a hooking section extending upward from the fixing section and bending toward the lift block, and a pressing section extending downward from the fixing section. The lift block has a projecting portion matched with the hooking section of the latch member. The press spring is located between the pressing section and the positioning housing.

Based on the above description, the lens connector-testing device as provided by the present invention has one positioning unit to hold the test-waiting lens connector, and then employs one probe to test the lens connector. Therefore, the present lens connector-testing device can be easily operated and has a high testing efficiency and a high testing accuracy. Moreover, the probe is connected to the circuit tester by the wires and does not fixed on any structure, so the probe can be flexibly used to test various lens connectors.

DETAILED DESCRIPTION OF THE PREFERRED EMBODIMENTS

The following embodiment with reference to the accompanying drawings now has been given for detail describing the technology, the feature, the object and the effect of the present invention.

Figure 1:
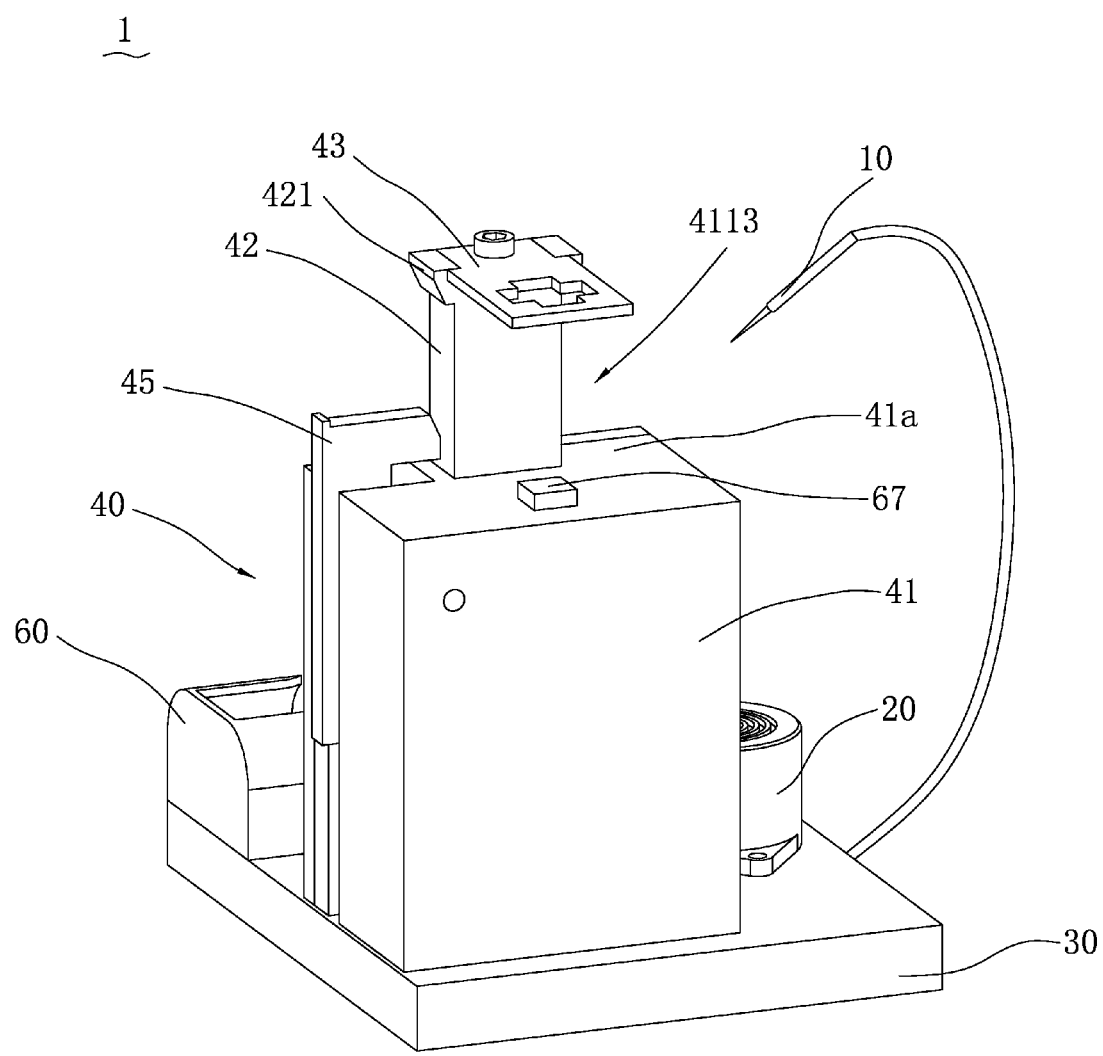
FIG. 1 is a perspective view of a lens connector-testing device according to one embodiment of the present invention.
Figure 2:
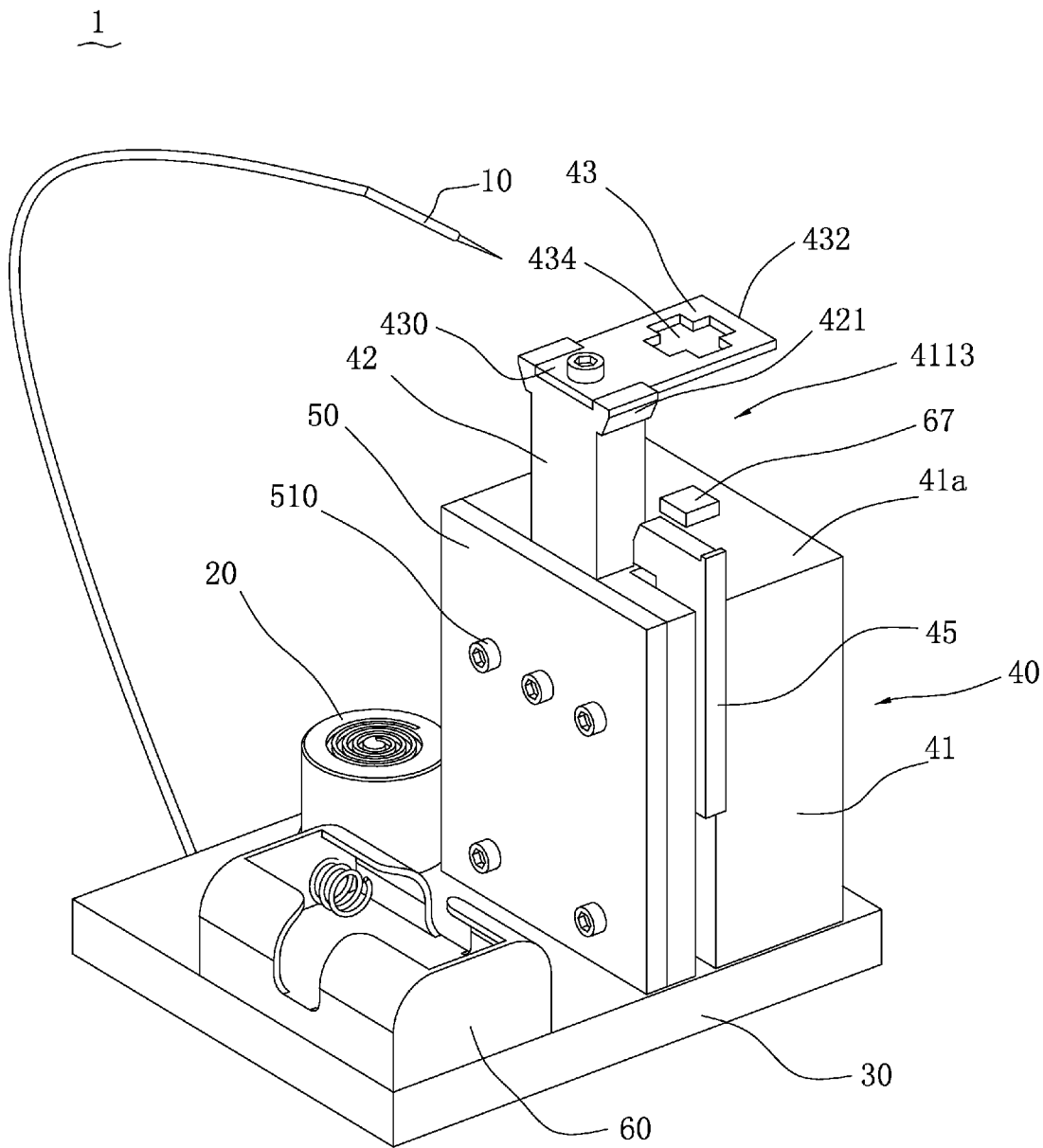
FIG. 2 is another perspective view of the lens connector-testing device of FIG. 1.
Figure 3:
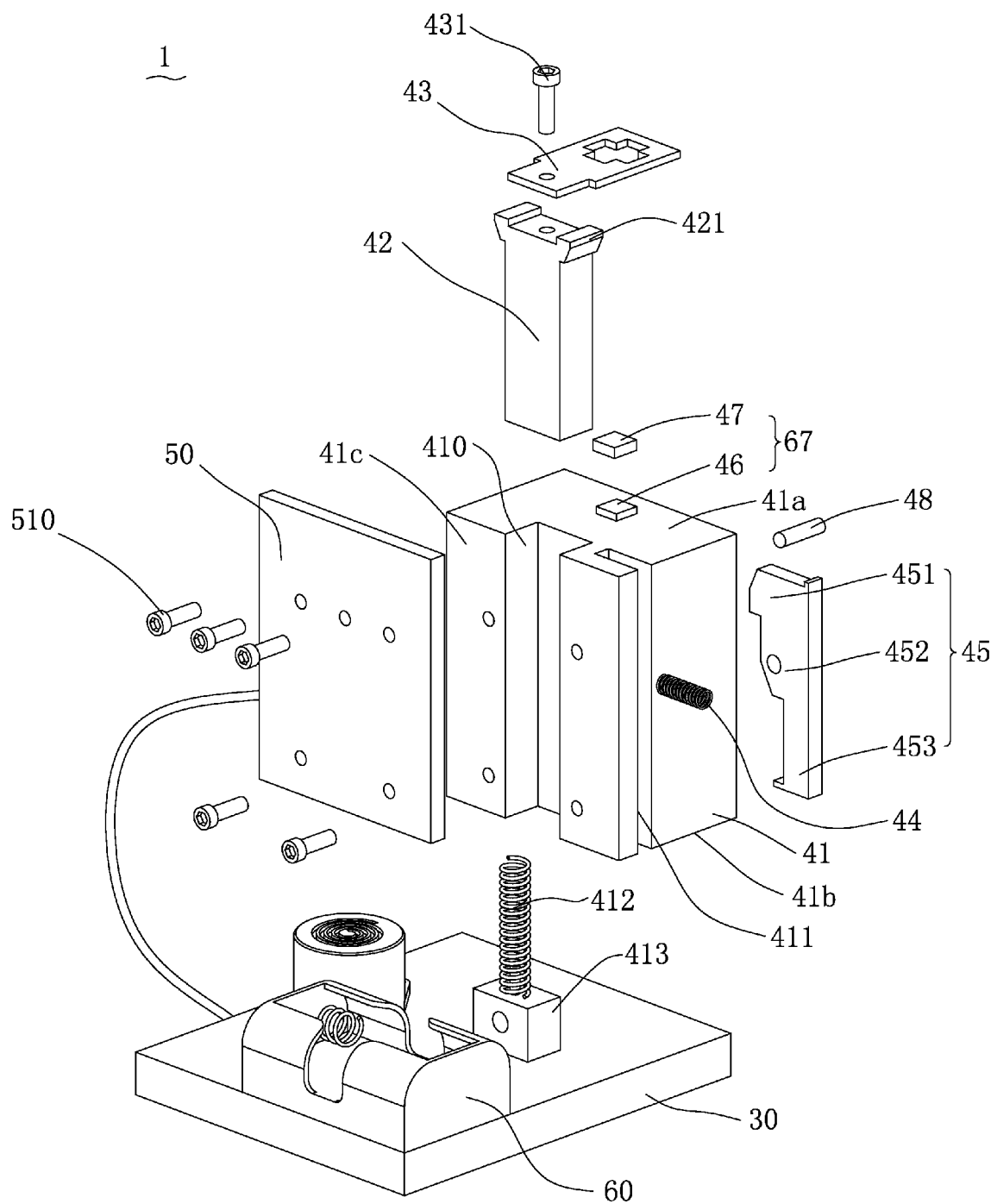
FIG. 3 is an exploded view of the lens connector-testing device of FIG. 2.
Figure 4:
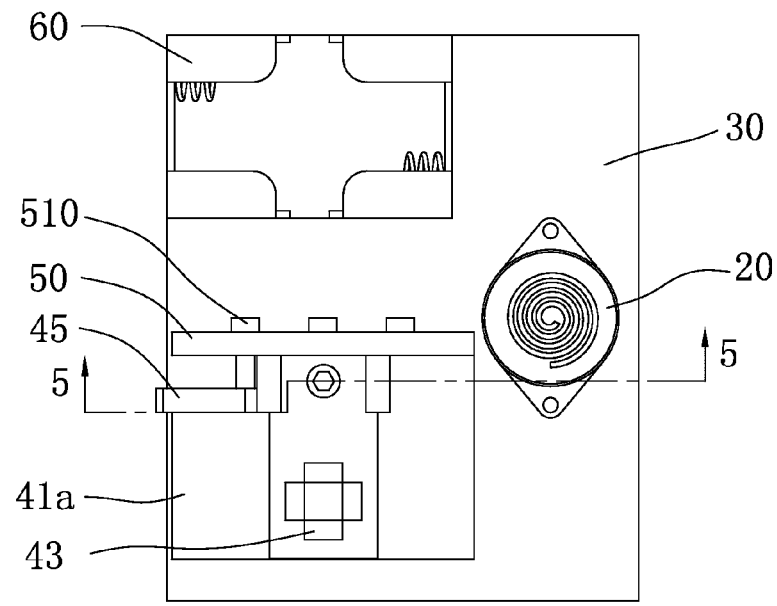
FIG. 4 is a plan view of the lens connector-testing device.

Please refer to FIG. 1 to 3, a lens connector-testing device 1 according to one embodiment of the present invention comprises a probe 10, a circuit tester 20, a base 30 and a positioning unit 40. The probe 10 is connected to the circuit tester 20 by wires. The circuit tester 20 is mounted on the base 30. The positioning unit 40 comprises a positioning housing 41, a lift block 42, an insulating plate 43, a press spring 44, a latch member 45 and a supporting seat 46. As shown in FIG. 3, the positioning housing 41 has a lift-guiding groove 410 formed on the sidewall thereof. One end 430 of the insulating plate 43 is fixedly connected to an upper end of the lift block 42, and a lower end of the lift block 42 is slidably received in the lift-guiding groove 410. A holding space 4113 labeled in FIG. 2 is defined between the other end 432 of the insulating plate 43 and the positioning housing 41. The supporting seat 46 is disposed on the positioning housing 41 located in the holding space 4113, and has at least one electrical contact that is electrically connected to the circuit tester 20 and may be electrically connected with a lens connector 47. The latch member 45 has a fixing section 452, a hooking section 451 extending upward from the fixing section 452 and bending toward the lift block 42, and a pressing section 453 extending downward from the fixing section 452. The fixing section 452 is pivotally jointed to the positioning housing 41. The lift block 42 has a projecting portion 421 matched with the hooking section 451 of the latch member 45. Specifically, a free end of the projecting portion 421 has an oblique plane and is projected from the lift block 42 to match with the hooking section 451.

In this embodiment, the positioning housing 41 has a latch-holding groove 411 passing through a top and bottom surfaces 41a, 41b thereof. The fixing section 452 of the latch member 45 is pivotally mounted into the latch-holding groove 411 by an anchor pin 48, and the press spring 44 is located between the pressing section 453 and the latch-holding groove 411. Specifically, a lift spring 412 is disposed in the lift-guiding groove 410 passing through the top and bottom surfaces 41a, 41b of the positioning housing 41. One end of the lift spring 412 contacts with the base 30 by a connecting block 413, and the other end thereof contacts with the lift block 42.

Referring to FIG. 3, on one embodiment of the present invention, the supporting seat 46 is used to simulate a lens, and the lens connector 47 is mounted onto the supporting seat 46 to form a lens module 67 for the convenience of the probe 10 testing. The lens connector-testing device 1 of the present invention employs the supporting seat 46 as a lens thereby avoiding using the real lens in testing and reducing the waste of the real lens.

The insulating plate 43 is vertically connected to the upper end of the lift block 42 by a retaining screw 431. Specifically, the lens connector-testing device 1 further comprises a cover 50 mounted on a sidewall 41c of the positioning housing 41, on which the lift-guiding groove 410 is formed.

The circuit tester 20 may be a buzzer, or any other warning device. The base 30 also disposes a power source 60 such as a dry battery for supplying the power to the buzzer. The buzzer can generate sound when the probe 10 tests the lens connector 47 is under the conducting state.

Referring to FIG. 1 to 7, the working principle of the present lens connector-testing device 1 is as follows:

First, the lens connector 47 is mounted on the supporting seat 46 to constitute the lens module 67.

Figure 5:
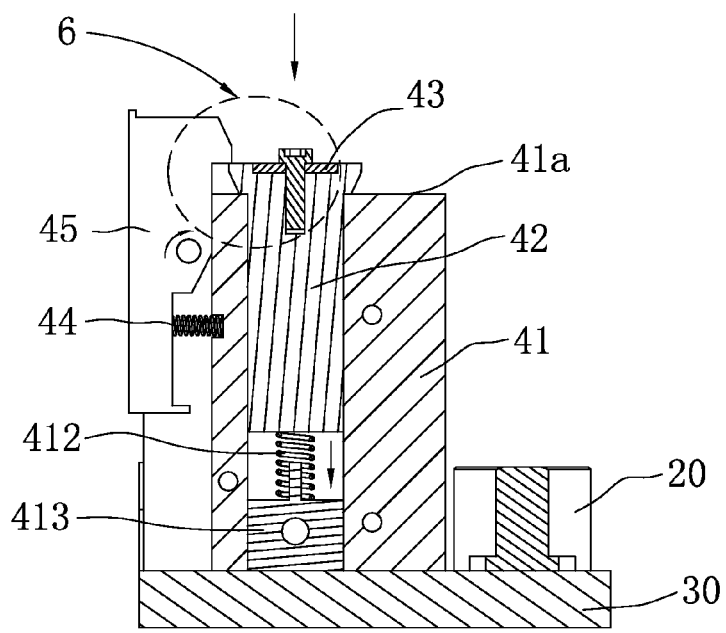
FIG. 5 is a sectional view of the lens connector-testing device along the A-A line in FIG. 4.
Figure 6:
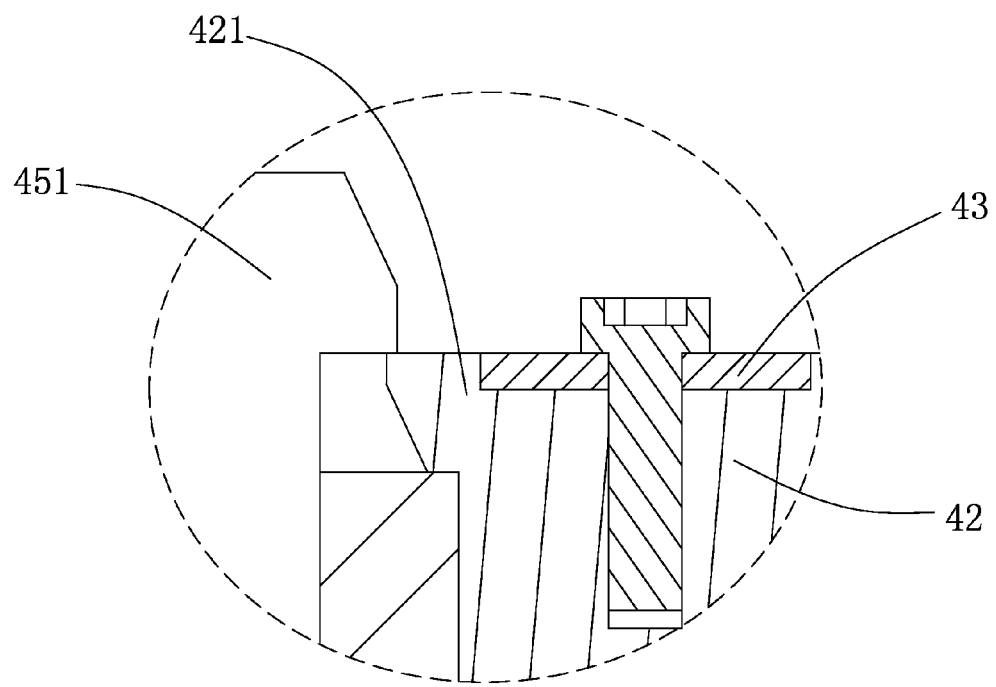
FIG. 6 is an enlarged view of part B of FIG. 5.
Figure 7:
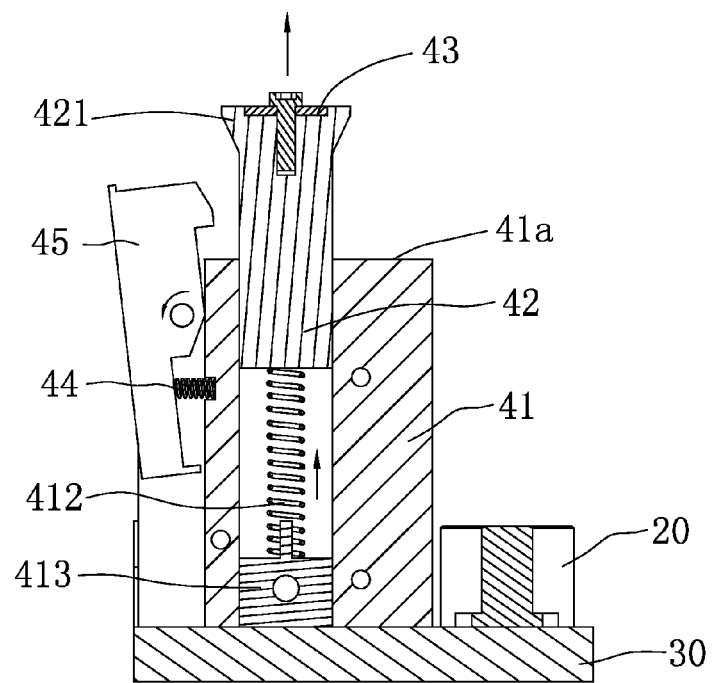
FIG. 7 is a sectional view under another state of the lens connector-testing device in FIG. 5.

Then, the lift block 42 is pushed down along the arrow direction of FIG. 5 and can further compress the lift spring 412, so that the projecting portion 421 can make the oblique plane of the free end push hooking section 451 away and the pressing section 453 of the latch member 45 can compress the press spring 44 simultaneously. When the lift block 42 is completely pushed down and arrives at the lowest place, the latch member 45 can be restored to the original place by the aid of the elastic force of the press spring 44. At the same time, the projecting portion 421 of the lift block 42 can match with the hooking section 451 of the latch member 45 again. During the course of the lift block 42 going down, the insulating plate 43 also moves downward and finally makes the lens connector 47 come into a hole 434 formed thereon thereby holding the lens connector 47 in the holding space 4113. The hole 434 is labeled in FIG. 2.

Next, the probe 10 can test the lens connector 47. If the buzzer 20 generates sound when the probe 10 contacts the contact of the lens connector 47, it proves that the connection of the lens connector 47 and the lens is conductive and lens connector 47 is good. Whereas if the buzzer 20 does not generate sound, it is proved that their connection is non-conductive and the lens connector 47 is bad. After one lens connector being tested, it is needed to press an outer side of the latch member 45 to make it rotate around the anchor pin 48 thereby releasing the matching state between the projecting portion 421 and the hooking section 451. Simultaneously, the pressing section 453 can compress the press spring 44. The lift block 42, together with the insulating plate 43, can be automatically raised at the original place under the function of the lift spring 412, thus the insulating plate 43 can release the tested lens connector 47 standing on the hole 434 and the tested lens connector 47 can be replace as next test-waiting lens connector. Finally, withdrawing the outside force exerted on the latch member 45 can make the latch member 45 automatically return to the original state under the function of the elastic force of the press spring 44.

As described above, the lens connector-testing device 1 of the present invention has one positioning unit 40 to hold the test-waiting lens connector 47, and then employs one probe 10 to test the lens connector 47. Therefore, the present lens connector-testing device 1 can be easily operated and has a high testing efficiency and a high testing accuracy.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A lens connector-testing device comprising:
   a base;
   a circuit tester, mounted on the base;
   a probe, connected to the circuit tester by wires; and
   a positioning unit, comprising a positioning housing, a lift block, an insulating plate, a press spring, a latch member and a supporting seat;
   wherein the positioning housing has a lift-guiding groove formed on a sidewall thereof, one end of the insulating plate is fixedly connected to an upper end of the lift block, a lower end of the lift block is slidably received in the lift-guiding groove, a holding space is defined between the other end of the insulating plate and the positioning housing, the supporting seat is disposed on the positioning housing located in the holding space and has at least one electrical contact electrically connected to the circuit tester and electrically connected with a lens connector, the latch member has a fixing section pivotally jointed to the positioning housing, a hooking section extending upward from the fixing section and bending toward the lift block, and a pressing section extending downward from the fixing section, the lift block has a projecting portion matched with the hooking section of the latch member, and the press spring is located between the pressing section and the positioning housing.

2. The lens connector-testing device as claimed in claim 1, wherein the insulating plate is vertically connected to the upper end of the lift block.

3. The lens connector-testing device as claimed in claim 1, wherein the lift-guiding groove passes through a top and bottom surfaces of the positioning housing.

4. The lens connector-testing device as claimed in claim 3, wherein a lift spring is disposed in the lift-guiding groove, one end of the lift spring contacts with the base, and the other end thereof contacts with the lift block.

5. The lens connector-testing device as claimed in claim 1, wherein the positioning housing has a latch-holding groove passing through the top and bottom surfaces thereof, and the fixing section of the latch member is pivotally mounted into the latch-holding groove.

6. The lens connector-testing device as claimed in claim 1, further comprising a cover mounted on the sidewall of the positioning housing having the lift-guiding groove.

7. The lens connector-testing device as claimed in claim 1, wherein a free end of the projecting portion has an oblique plane and is projected from the lift block.

8. The lens connector-testing device as claimed in claim 1, wherein the circuit tester is a buzzer.

9. The lens connector-testing device as claimed in claim 1, wherein the base further disposes a power source.

10. The lens connector-testing device as claimed in claim 9, wherein the power source includes a dry battery.

* * * * *